United States Patent [19]

Sathi et al.

[11] Patent Number: 5,357,607
[45] Date of Patent: Oct. 18, 1994

[54] FILE STORAGE PROCESS FOR ELECTRONIC PRINTING SYSTEMS HAVING MULTIPLE DISKS

[75] Inventors: Kitty Sathi, Pittsford; Ronald A. Ippolito, Rochester; Randall J. Stegbauer, Ontario; Colleen R. Enzien, Penfield, all of N.Y.

[73] Assignee: Xerox Corporation, Stamford, Conn.

[21] Appl. No.: 678,926

[22] Filed: Apr. 1, 1991

[51] Int. Cl.⁵ .............................................. G06F 15/00
[52] U.S. Cl. ................................. 395/166; 395/164; 395/575; 395/600
[58] Field of Search ................................. 395/162–166, 395/575, 600, 700, 110, 115, 116; 364/200 MS File, 900 MS, 248.1, 268, 285.1; 371/10.1, 13; 369/53, 54, 84; 340/798–799; 345/203, 201

[56] References Cited

U.S. PATENT DOCUMENTS

| 4,020,466 | 4/1977 | Cordi et al. ............... 364/DIG. 1 |
| 4,937,864 | 6/1990 | Caseiras et al. ........................ 380/4 |
| 5,083,264 | 1/1992 | Platteter et al. .................... 395/575 |
| 5,136,707 | 8/1992 | Block et al. ............... 364/DIG. 1 |
| 5,212,786 | 5/1993 | Sathi ................................... 395/600 |

OTHER PUBLICATIONS

Kris Jamsa, DOS; The Complete Reference, 3rd Ed, 1991, pp. 121–129, 597–602.

Primary Examiner—Mark R. Powell
Assistant Examiner—Kee M. Tung
Attorney, Agent, or Firm—Frederick E. McMullen; Gary B. Cohen

[57] ABSTRACT

An electronic printing system with plural hard disks for storing system files in which critical system files are stored in duplicate at the same address on each disk, while non-critical files are divided into smaller segments with each file segment stored on a different one of the hard disks.

15 Claims, 17 Drawing Sheets

FILE STORAGE PROCESS FOR ELECTRONIC PRINTING SYSTEMS HAVING MULTIPLE DISKS

CROSS REFERENCES TO RELATED APPLICATIONS

The present application is related to the following U.S. Patents, which are assigned to the same assignee as is the present application and incorporated by reference herein: Smith et al. U.S. Pat. No. 5,263,152; Sathi et al. U.S. Pat. No. 5,212,786; Sathi et al. U.S. Pat. No. 5,257,377; Slomcenski et al. U.S. Pat. No. 5,241,672; and Ippolito et al. U.S. Pat. No. 5,249,288.

BACKGROUND OF THE INVENTION

The invention relates to electronic printers and printing systems, and more particularly, to a file storage process for such systems.

An important task of the operating system in an electronic printing system is the maintenance of files which are permanent objects recorded on backing storage such as hard disks. A file consists of a sequence of pages, the contents of which must be preserved across system restarts. The file system provides the operating system with facilities for creating, organizing, reading, writing, modifying, copying, moving, deleting, and controlling access to the files. Since certain files are critical, it is desirable to have a fail-safe system for preserving these files in the event one of the hard disks fails. Otherwise, if the failed disk needs to be replaced, the files on the disk are lost. At the same time, it is desirable to enhance the effectiveness and speed for writing and reading of files to and from the disks and to facilitate the loading of new or upgraded software to the disks.

SUMMARY OF THE INVENTION

While it is known in the prior art to store the operating software for a reproduction machine on a hard disk, as shown in Caseiras et al U.S. Pat. No. 4,937,864, there is no disclosure to file storage process for a xerographic printing system in which the printing system includes printer means for producing prints from image data and plural disks providing permanent memory for storing system files, comprising the steps of: segregating the system files into critical files requiring a high level of file integrity and non-critical files requiring a lower level of file integrity; storing the critical files in duplicate on each of the disks to provide file backup and assure the high level of file integrity; separating each of the non-critical files into a series of segments each having a predetermined number of bytes with the total number of the segments being an even multiple of the number of the disks; separating the segments into blocks with the number of the segments in each block being equal to the number of the disks; and storing the blocks of segments on the disks so that each of the segments in each of the blocks is stored on only one of the disks.

DESCRIPTION OF A PREFERRED EMBODIMENT OF THE DISCLOSURE

Figure 1:
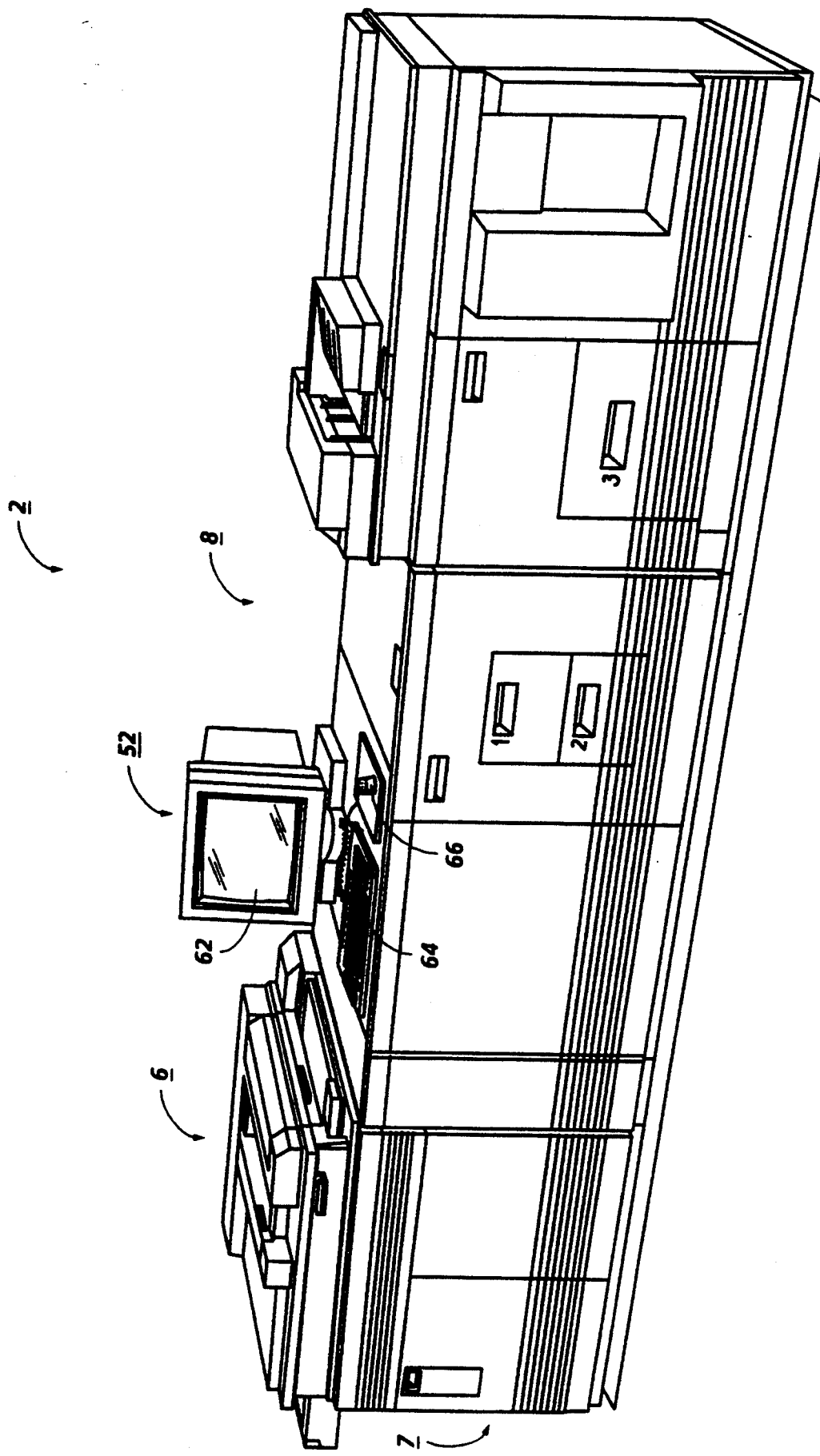
FIG. 1 is a view depicting an electronic printing system incorporating the file storing process of the present invention.
Figure 2:
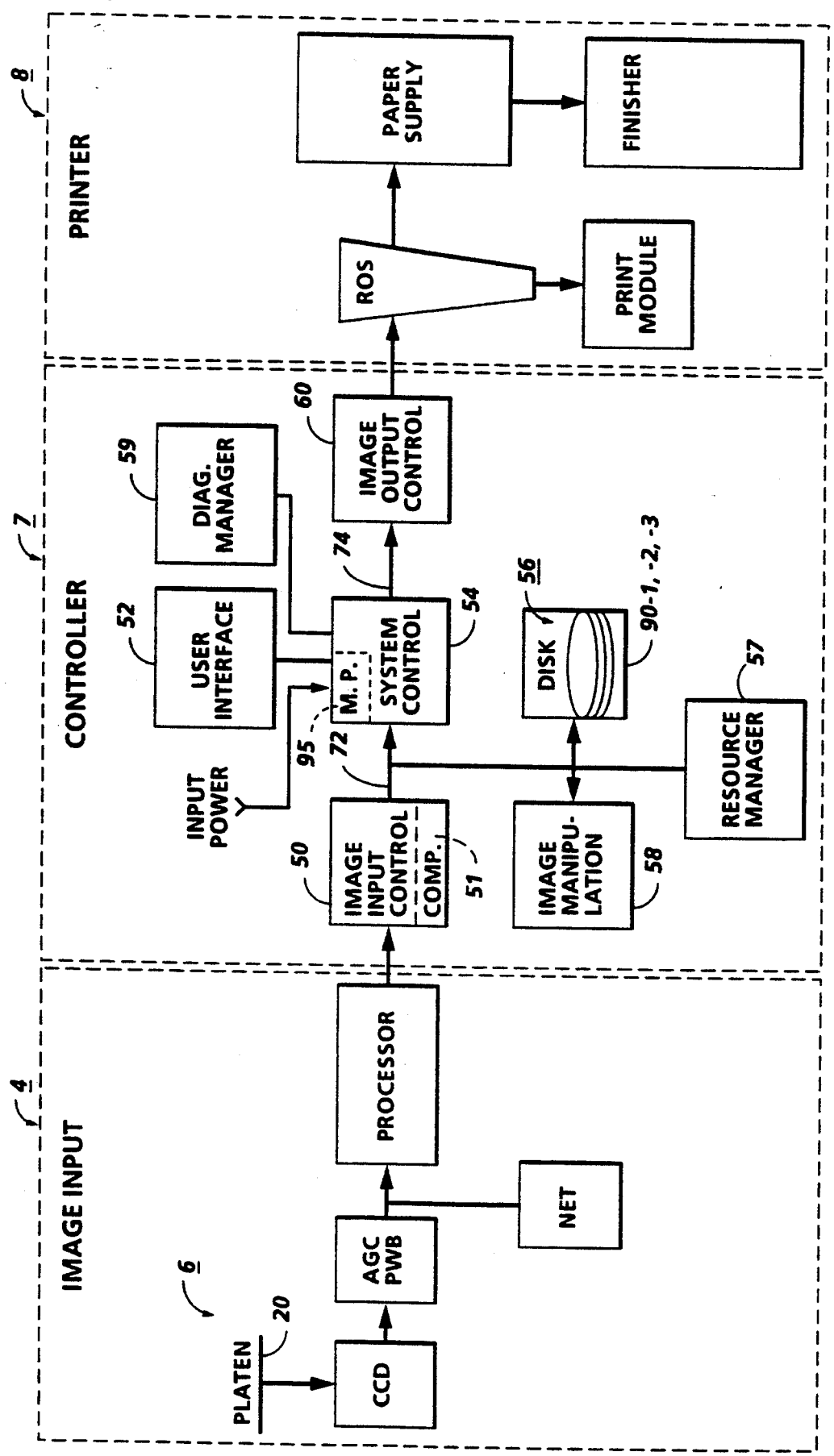
FIG. 2 is a block diagram depicting the major control system elements of the printing system shown in FIG. 1.

Referring to drawings where like reference numerals designate identical or corresponding parts throughout the several views, and more particularly to FIGS. 1 and 2, there is shown an exemplary image printing system 2 for processing print jobs in accordance with the teachings of the present invention. Printing system 2 for purposes of explanation is divided into image input section 4, controller section 7, and printer section 8. In the example shown, image input section 4 has both remote and on-site image inputs, enabling system 2 to provide network, scan, and print services. Other system combinations may be envisioned such as a stand alone printing system with on-site image input (i.e., a scanner), controller, and printer; a network printing system with remote input, controller, and printer; etc.

While a specific printing system is shown and described, the present invention may be used with other types of printing systems. For example, printer section 8 may instead use a different printer type such as ink jet, ionographic, thermal, photographic, etc., and furthermore may be incorporated in electronic display systems, such as CRTs, LCDs, LEDs, etc. or else other image scanning/processing/recording systems, or else other signal transmitting/receiving, recording systems, etc. as well.

A more detailed description of printing system 2 may be found in copending U.S. patent application Ser. No. 07/620,519, filed Nov. 30, 1990, to James R. Graves et al, and entitled "System for Scanning Signature Pages", the disclosure of which is incorporated by reference herein.

Referring to FIG. 2, controller section 7 is, for explanation purposes, divided into an image input controller 50, User Interface (UI) 52, system controller 54, disk memory 56, image manipulation section 58, Resource Manager 57, Diagnostic Manager 59, and image output controller 60.

As best seen in FIG. 1, UI 52 includes a combined operator controller/CRT display consisting of an interactive touchscreen 62, keyboard 64, and mouse 66. UI 52 interfaces the operator with printing system 2, enabling the operator to program print jobs and other instructions, to obtain system operating information, visual document facsimile display, programming information and icons, diagnostic information and pictorial views, etc. Items displayed on touchscreen 62 such as files and icons are actuated by either touching the displayed item on screen 62 with a finger or by using mouse 66 to point cursor 67 to the item selected and keying the mouse.

Referring to FIGS. 2 and 3A–3C, the scanned image data input from scanner section 6 to controller section 7 is compressed by image compressor/processor 51 of image input controller 50 on PWB 70-3. The compressed image data with related image descriptors are placed in image files and temporarily stored in system memory 61 pending transfer to main memory 56 where the data is held pending use.

When the compressed image data in memory 56 requires further processing, or is required for display on touchscreen 62 of UI 52, or is required by printer section 8, the data is accessed in memory 56 and transferred to system memory 61. Where further processing other than that provided by processor 25 is required, the data is transferred to image manipulation section 58 on PWB 70-6 where additional processing steps such as collation, make ready (document editing), decomposition, rotation, etc. are carried out. Following processing, the data may be returned to main memory 56, sent to UI 52 for display on touchscreen 62, or sent to image output controller 60.

Resource Manager 57 controls access to disks and RAM 61 of files while diagnostic manager 59 handles system faults.

Image data output to image output controller 60 is decompressed and readied for printing and output to printer section 8. Image data sent to printer section 8 for printing is normally purged from memory 56 to make room for new image data.

Figure 3A:
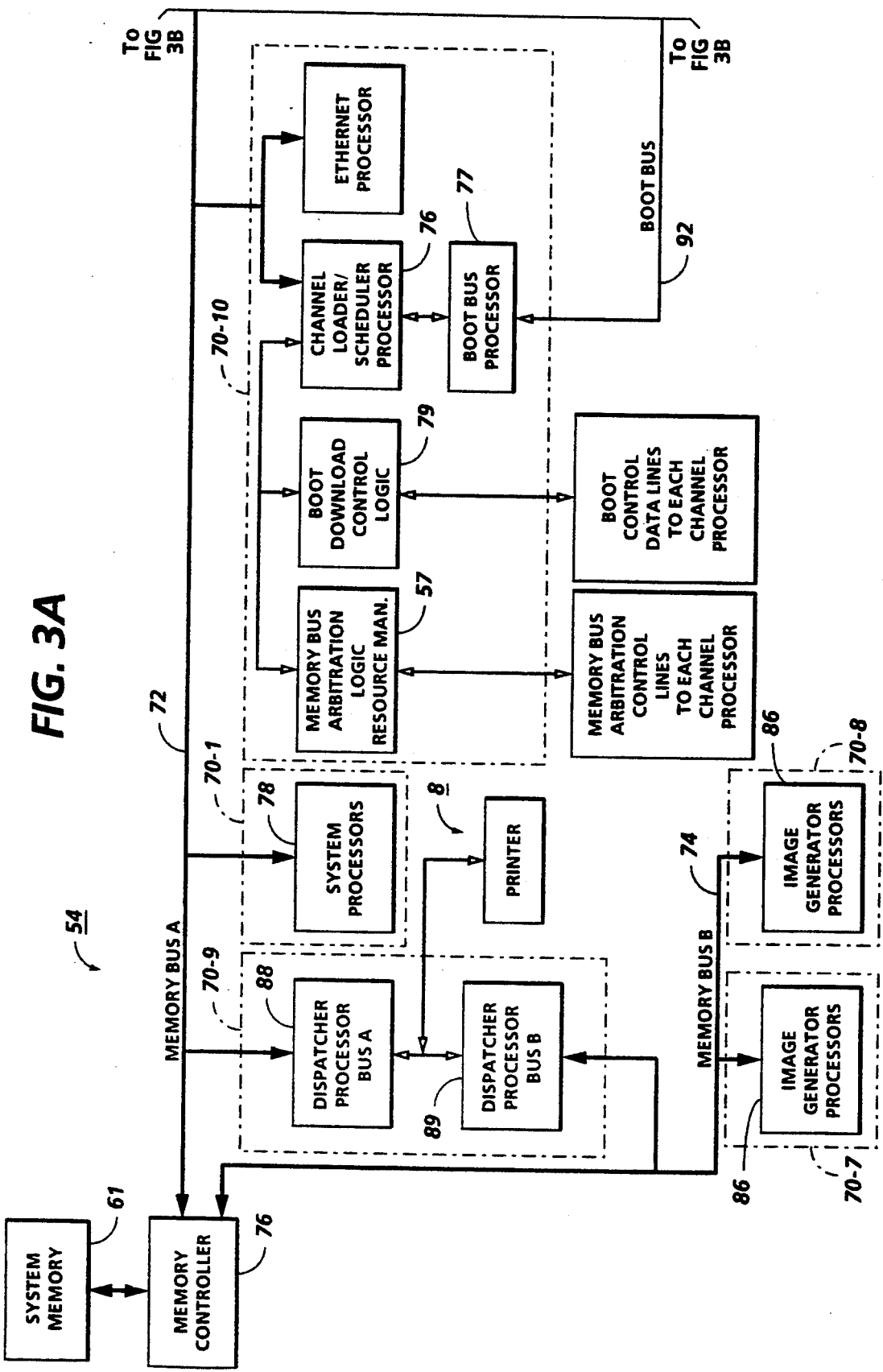
FIGS. 3A, 3B, and 3C comprise a schematic block diagram showing the major parts of the control section for the printing system shown in FIG. 1.
Figure 3B:
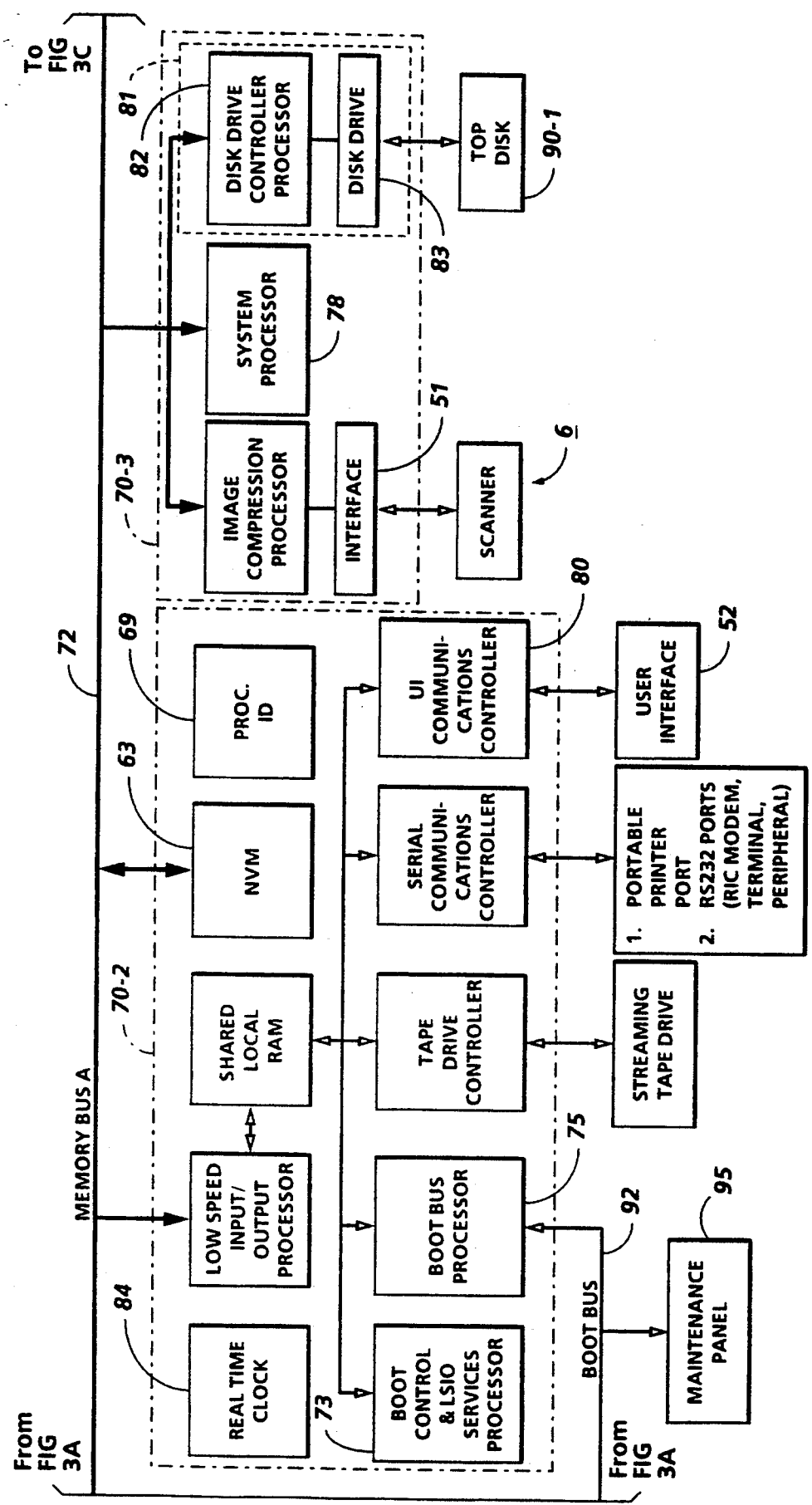
Figure 3C:
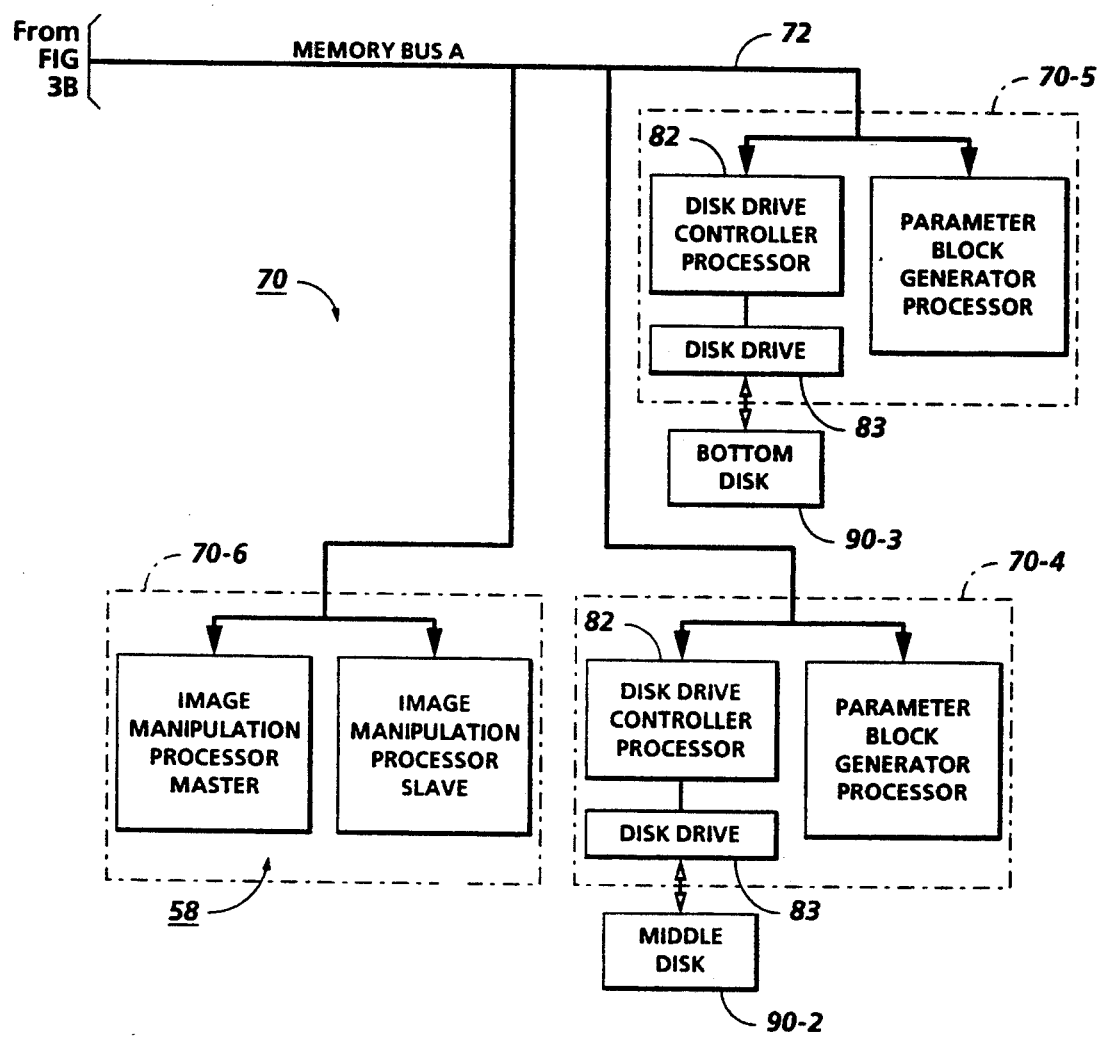

As shown in FIGS. 3A–3C, controller section 7 includes a plurality of Printed Wiring Boards (PWBs) 70, PWBs 70 being coupled with one another and with System Memory 61 by a pail of memory buses 72, 74. Memory controller 76 couples System Memory 61 with buses 72, 74. PWBs 70 include system processor PWB 70-1 having plural application or system processors 78; low speed I/O processor PWB 70-2 having UI communication controller 80 for transmitting data to and from UI 52, Boot Control & LSIO Services Processor 73, and Boot Bus Processor 75; PWBs 70-3, 70-4, 70-5 having disk drive controller/processors 82 with disk drives 83 for transmitting data to and from disks 90-1, 90-2, 90-3 respectively of main memory 56 (image compressor/processor 51 for compressing the image data and another application processor 78 are on PWB 70-3); image manipulation PWB 70-6 with image manipulation processors of image manipulation section 58; image generation processor PWBs 70-7, 70-8 with image generation processors 86 for processing the image data for printing by printer section 8; dispatch processor PWB 70-9 having dispatch processors 88, 89 for controlling transmission of data to and from printer section 8; and boot control-arbitration-scheduler PWB 70-10 having Channel Loader/Scheduler Processor 76, Boot Bus Processor 77, Boot Download Control Logic 79, and Memory Bus Arbitration Logic/Resource Manager 57. As will appear, Loader/Scheduler Processor 76 has two functions, one as a Boot channel to bring the system to the ready state and the other as a scheduler channel used to decide which channel performs which task and in which sequence the tasks will be performed.

Each independent processor and associated circuitry form a channel 81. Channels 81 (an example is shown in FIG. 3B) are independent processors for handling the applications software, or input/output processors for handling peripheral devices such as disk drives. For example, there are disk channels used to interface disk drives 83 for disks 90-1, 90-2, 90-3, scanner interface channel, printer interface channel, etc.

Main memory 56 has plural hard disks 90-1, 90-2, 90-3 on which image files 140 and system files 142 are stored. System files comprise system operating files such as boot files 124, software files, data files 122, etc., while image files are typically files of scanned image data. System files are viewed as critical because of their importance to the operation of the system while image files are viewed as non-critical since these files may be re-captured by re-scanning the source document.

System memory 61, which comprises a Random Access Memory or RAM, serves as a temporary store for data required during system operations. Memory 61 stores bits of data which can be written to (Data Entered) or read from (Data Used) the memory. Other data in memory 61 is used for reference and remains loaded as long as power is supplied. Since memory 61 is volatile, that is, all data is lost when power to memory 61 is terminated, Non Volatile Memory or NVM, which essentially comprise RAM memory with battery backup to supply DC voltage when power is turned off, are provided at several locations in the system as, for example, NVM 63 on Low Speed I/O Processor PWB 70-2 (FIG. 3B). NVM 63 is used to store file management updates and file content updates.

Figure 4:
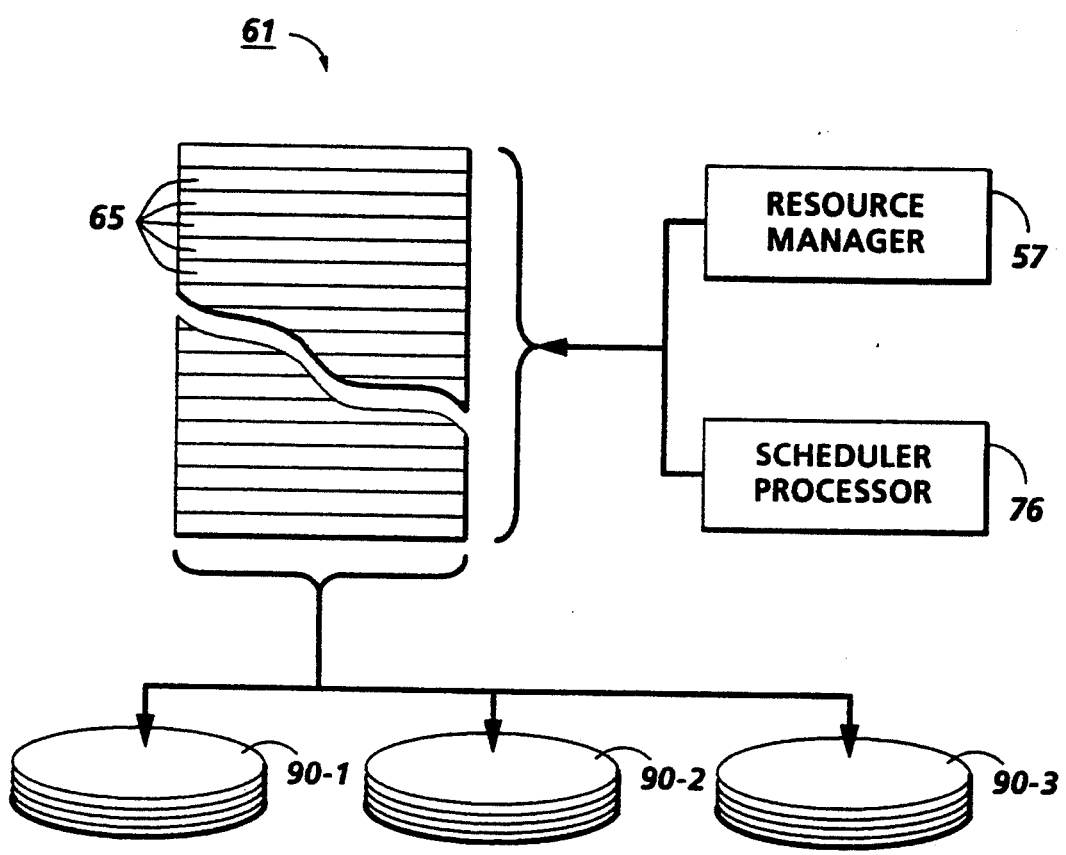
FIG. 4 is a block diagram depicting the process for transferring data from temporary RAM memory to hard disks.

Referring now to FIG. 4, Resource Manager 57 schedules access to disks 90-1, 90-2, 90-3 for clients. Data to be transferred to disks 90-1, 90-2, 90-3 is held in system memory 61 which is managed as a chain of buffers 65 by Resource Manager 57. For this, buffers 65 assigned to the clients are handed to Resource Manager 57 and then written to the disk 90-1, 90-2, 90-3 whenever disk bandwidth is available. However, each seek incurs a seek overhead. To minimize the number of seeks when a client is updating files, buffers 65 are chained together and written out to the disks as one operation. Resource Manager 57 links together buffers 65 that are to be written to contiguous locations on disks 90-1, 90-2, 90-3, writing being in response to attaining a preset threshold.

Copending U.S. patent application Ser. No. 07/590,634, filed Sep. 28, 1990, to George L. Eldridge, and entitled "Method of Operating Disk Drives in Parallel", the disclosure of which is incorporated by reference herein, describes what will be referred to herein as Super Disk. Super Disk allows faster read/write access to files since all disks 90-1, 90-2, 90-3 can be accessed simultaneously. The risk incurred in this type of arrangement, however, is the loss of parts of a file should one or more of the disks fail which effectively results in loss of the entire file.

Figure 5:
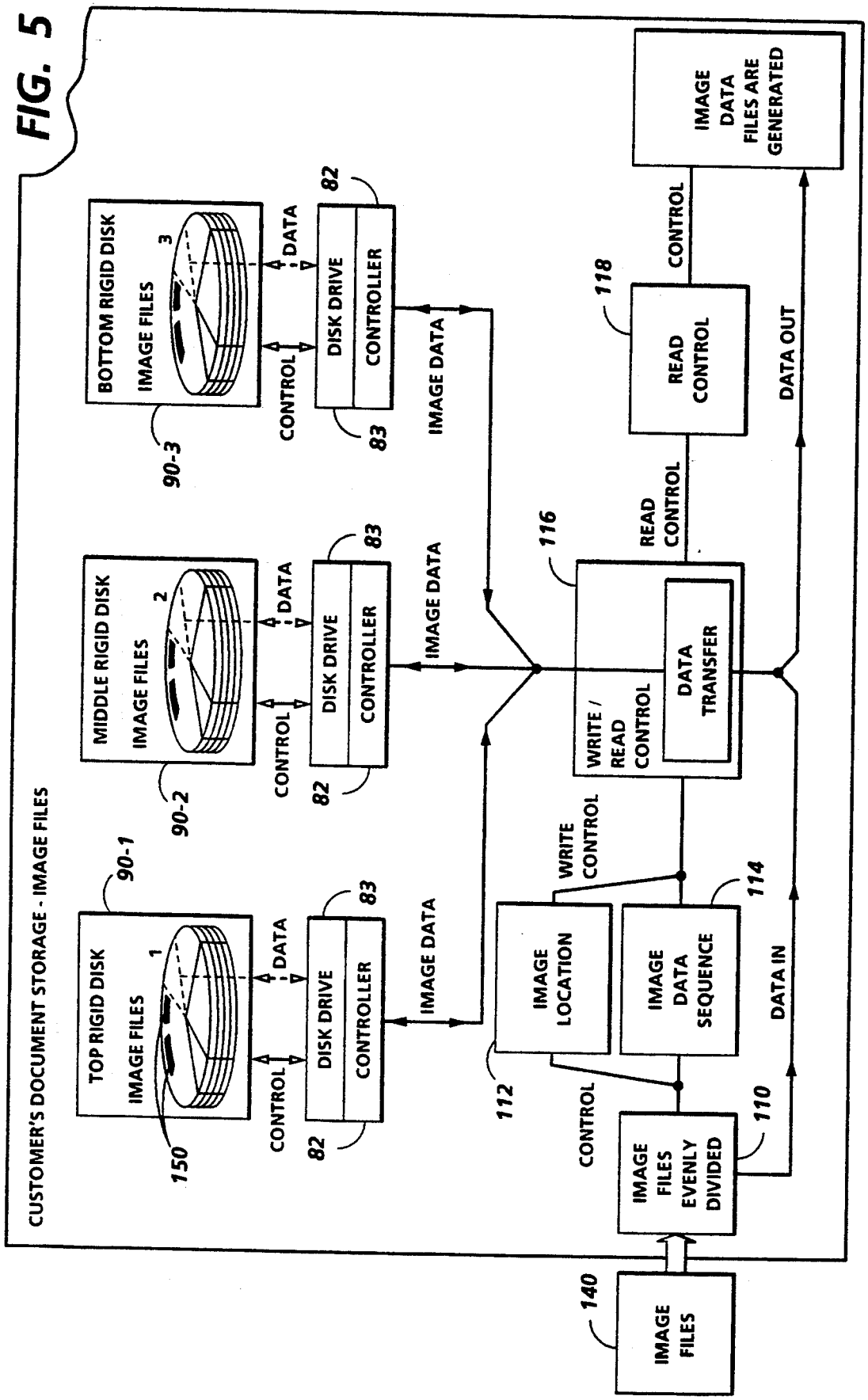
FIG. 5 is a block diagram depicting the process for storing image files on disks to provide super disk files.

Referring to FIG. 5, to implement Super Disk, image files 140 to be transferred to disks 90-1, 90-2, 90-3 are divided by divider logic 110 into an even number of segments or sectors 150, each sector 150 being a preset number of bytes. The sectors are written in succession to successive disks until all of the sectors that comprise the image file are stored. Where N is equal to the number of disks, the total number of sectors 150 is an even multiple of N. In the example discussed, there are 3 disks 90-1, 90-2, 90-3 and therefore N=3. Accordingly, image files are divided into a plurality of sectors 150 which are in effect grouped into blocks of 3 sectors each. That is, sector 1 of image file 140 is written to disk 90-1, sector 2 to disk 90-2, sector 3 to disk 90-3, sector 4 to disk 90-1, sector 5 to disk 90-2, and so forth and so on. As will be understood, where the number of bytes in a file is not evenly divisible into sectors 150, one or more of the sectors 150 in the last block may be empty or partially empty of data. As a result, one larger storage media or super disk is effectively formed.

Image location logic 112 designates the location for each sector on disks 90-1, 90-2, 90-3, with the address of each corresponding block of sectors (i.e., sectors 1, 2, 3; sectors 4, 5, 6, etc) being the same. Image data sequence logic 114 controls the disk writing sequence, while write/read control logic 116 provides the actual instructions to write or read image data to or from disks 90-1, 90-2, 90-3. Image data read from disks 90-1, 90-2, 90-3 is reconstructed by read control logic 118 which reads the image file sectors back from disks 90-1, 90-2, 90-3 in the same manner as the data was written to disks 90-1, 90-2, 90-3.

Figure 6:
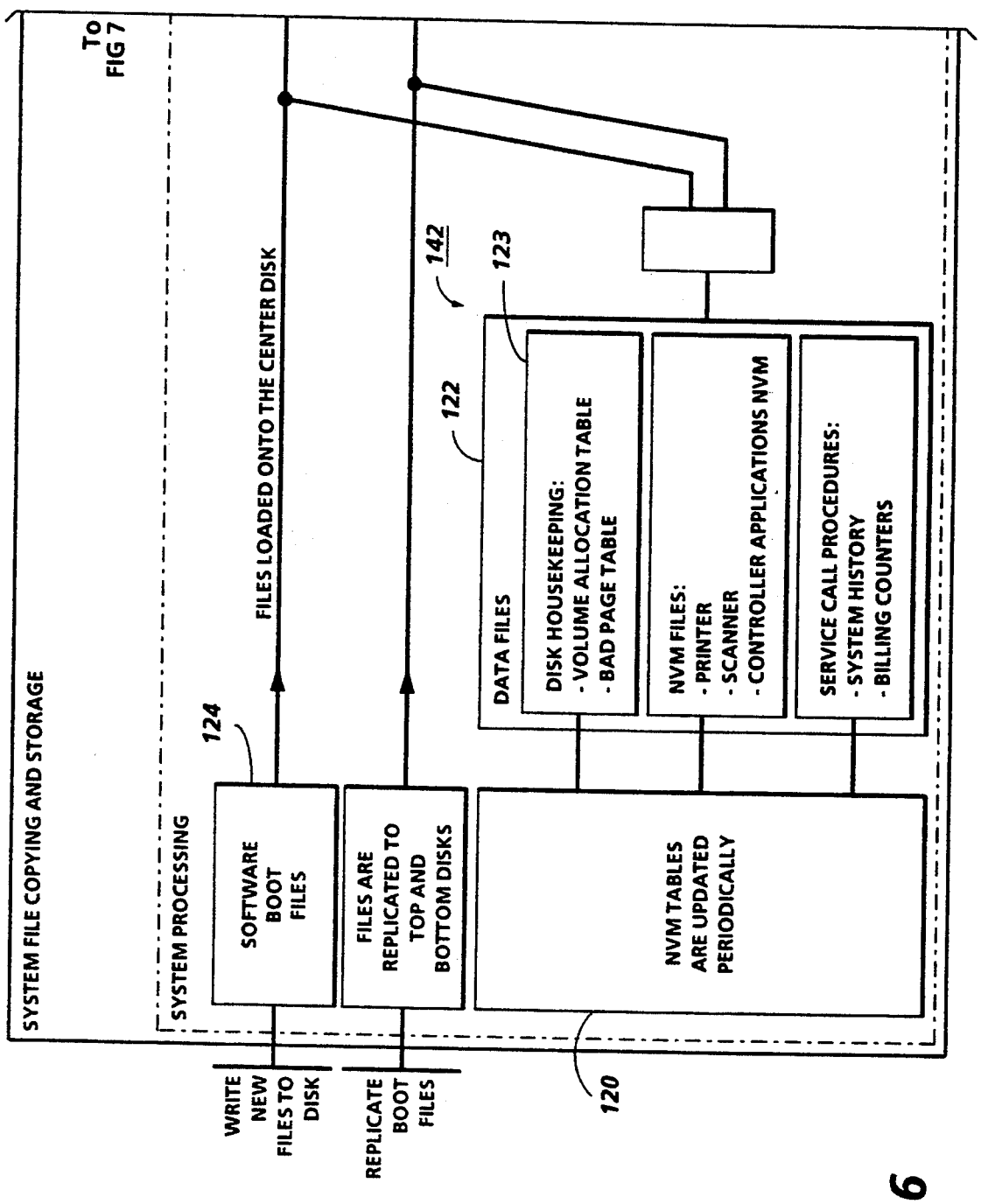
FIG. 6 is a block diagram depicting the process for collecting system files for storage on disks.
Figure 7:
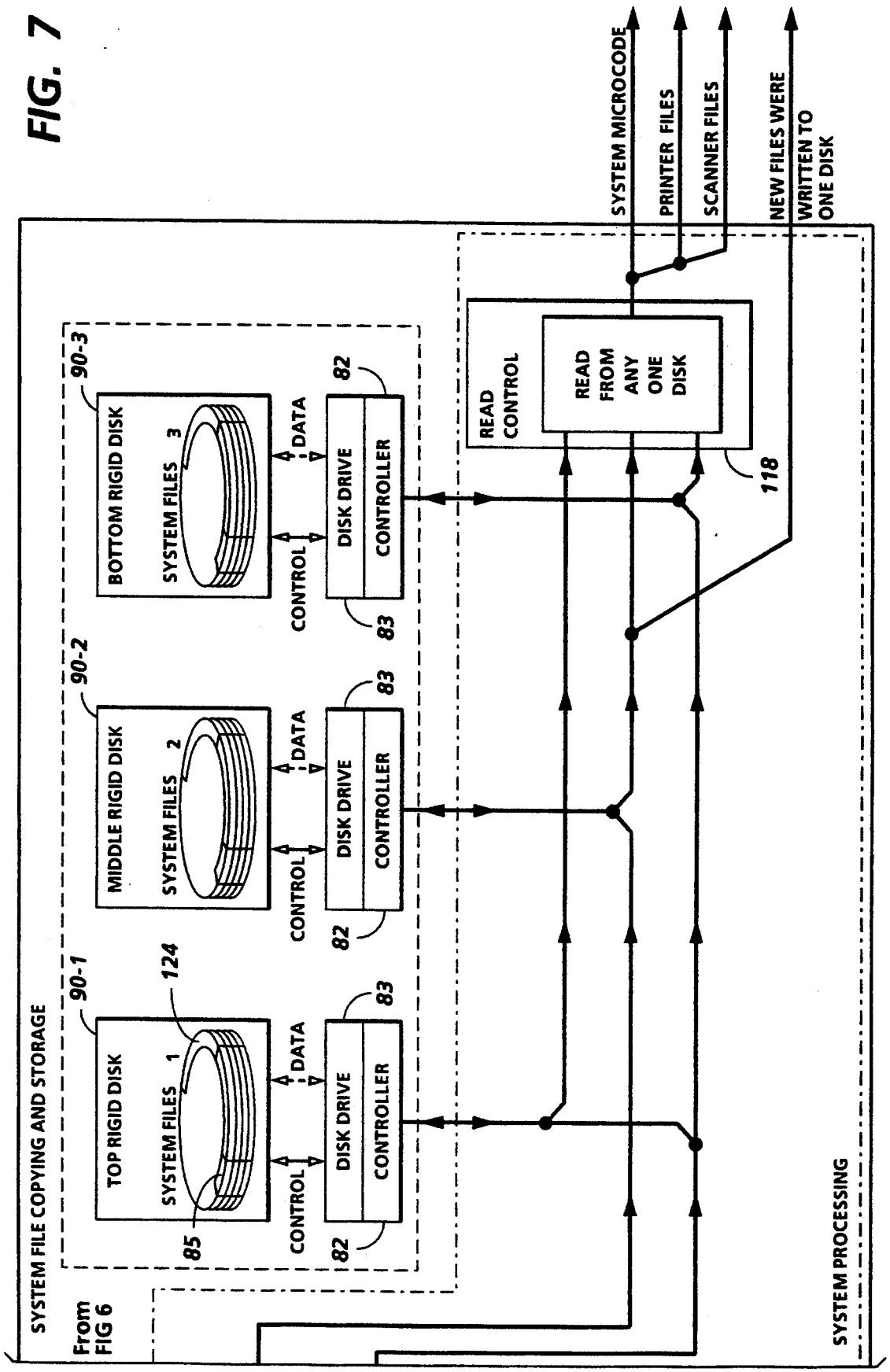
FIG. 7 is a block diagram depicting the process for replicating system files collected from FIG. 6 on disks.
Figure 8:
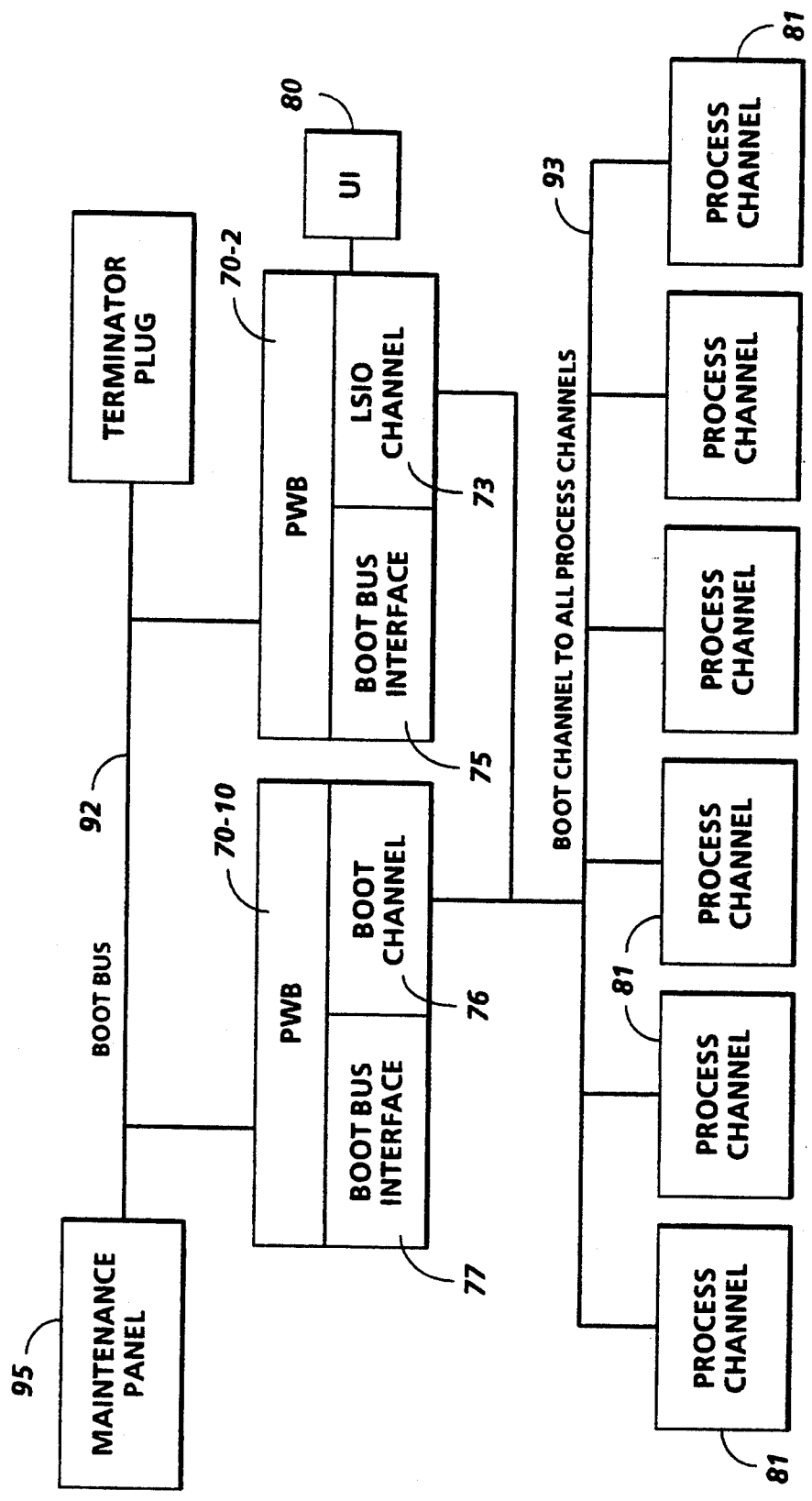
FIG. 8 is a block diagram showing the boot system for booting the printing system depicted in FIG. 1 to an operating state.
Figure 9:
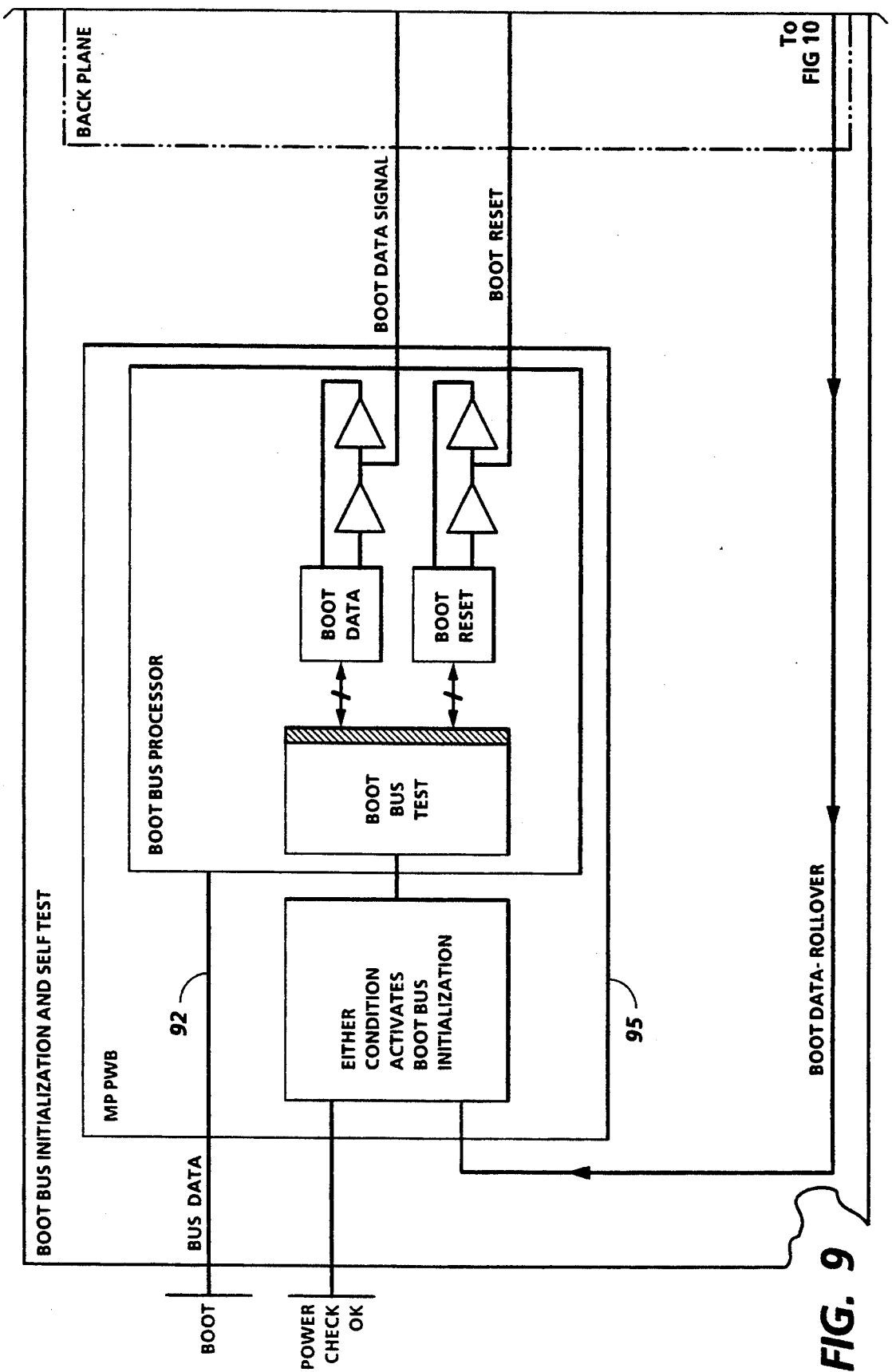
FIG. 9 is a block diagram showing the boot initializing and self-testing carried out during booting.
Figure 10:
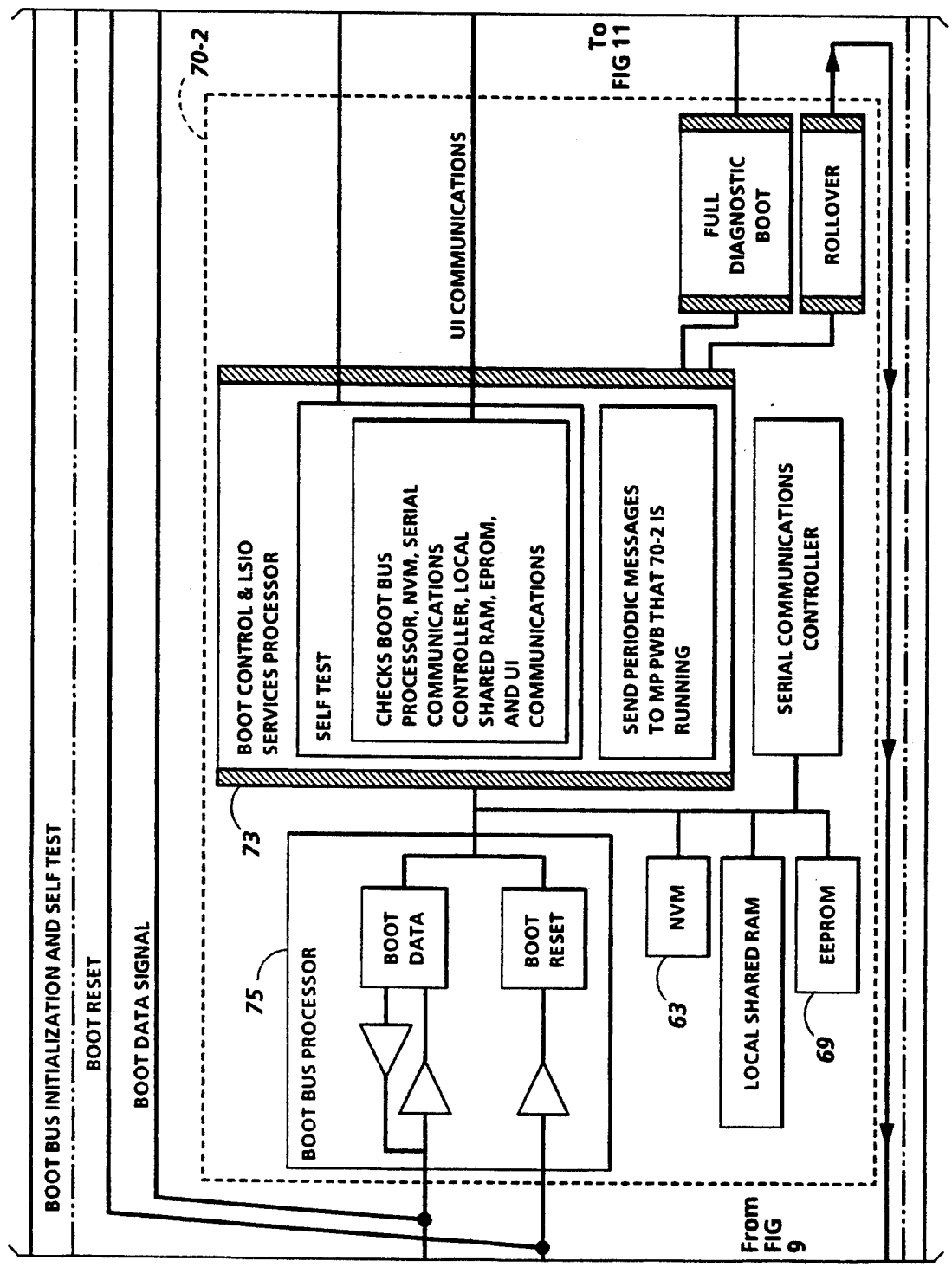
FIG. 10 is a block diagram showing the process for initializing the system boot control and LSIO services processor during booting.
Figure 11:
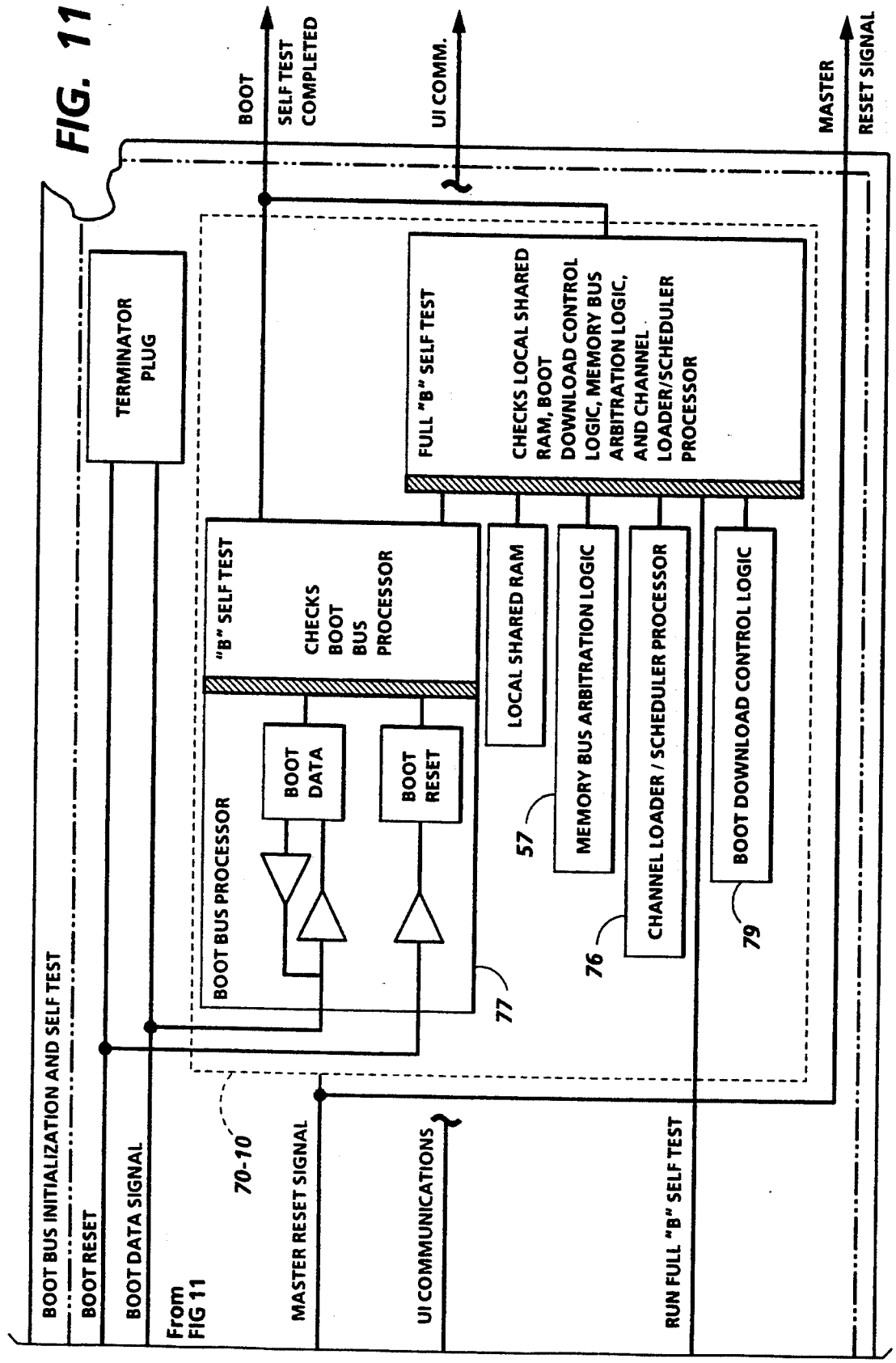
FIG. 11 is a block diagram showing the process for initializing the system channel loader/scheduler processor, boot download control logic, and memory bus arbitration logic during booting.
Figure 12:
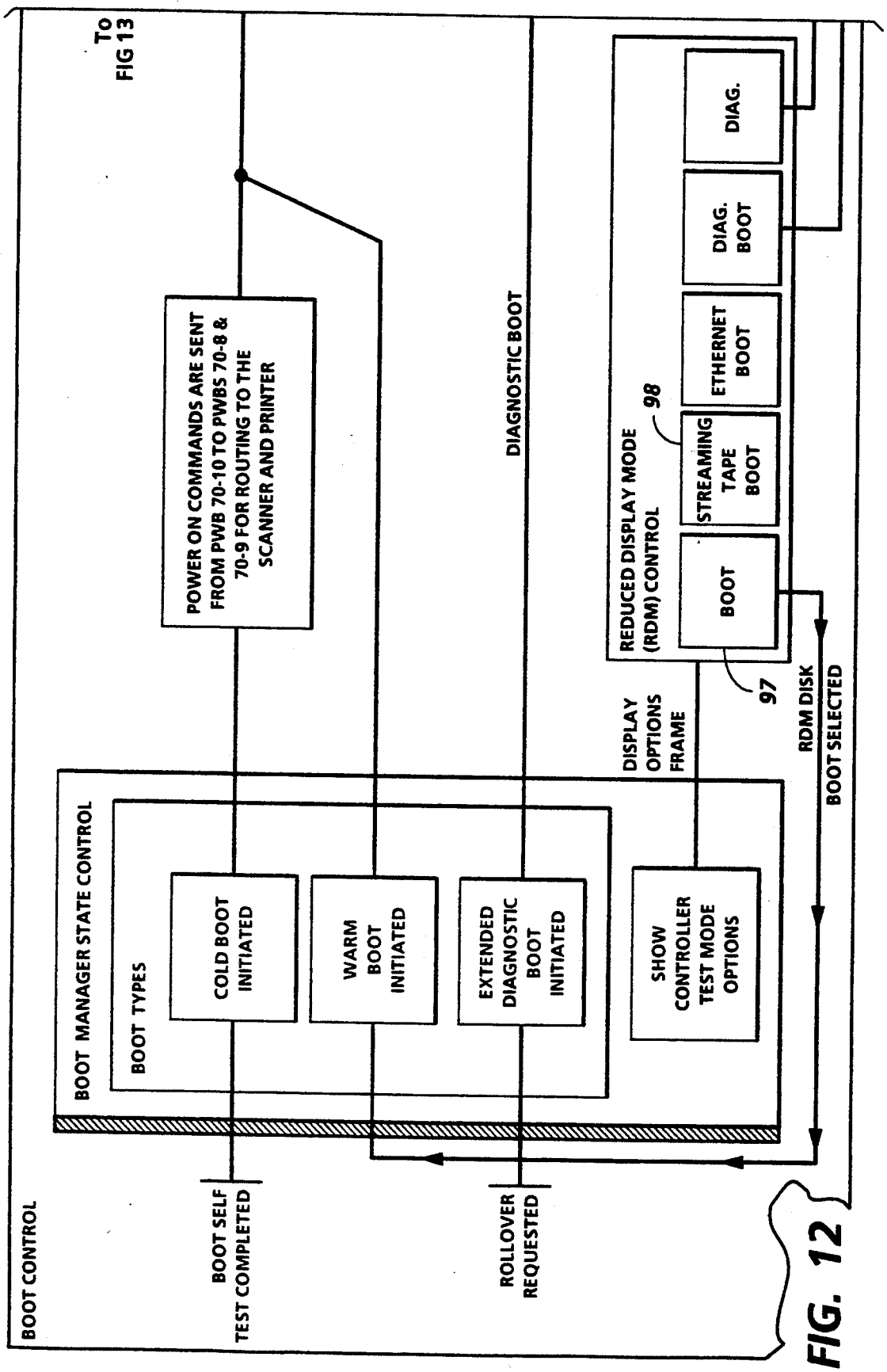
FIG. 12 is a block diagram depicting cold and warm boot implementations.
Figure 13:
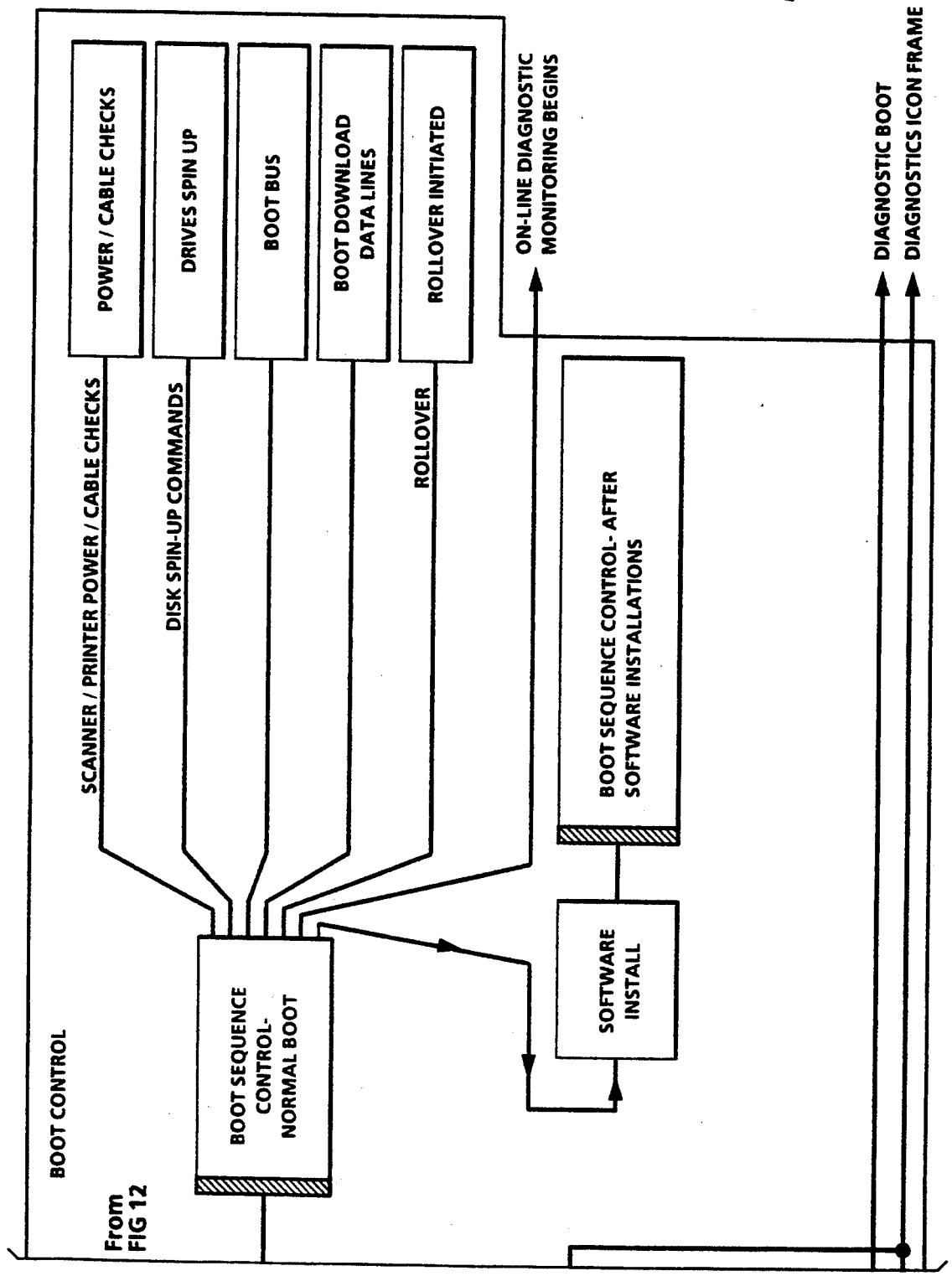
FIG. 13 is a block diagram depicting disk spin-up and software downloading processes during booting.
Figure 14:
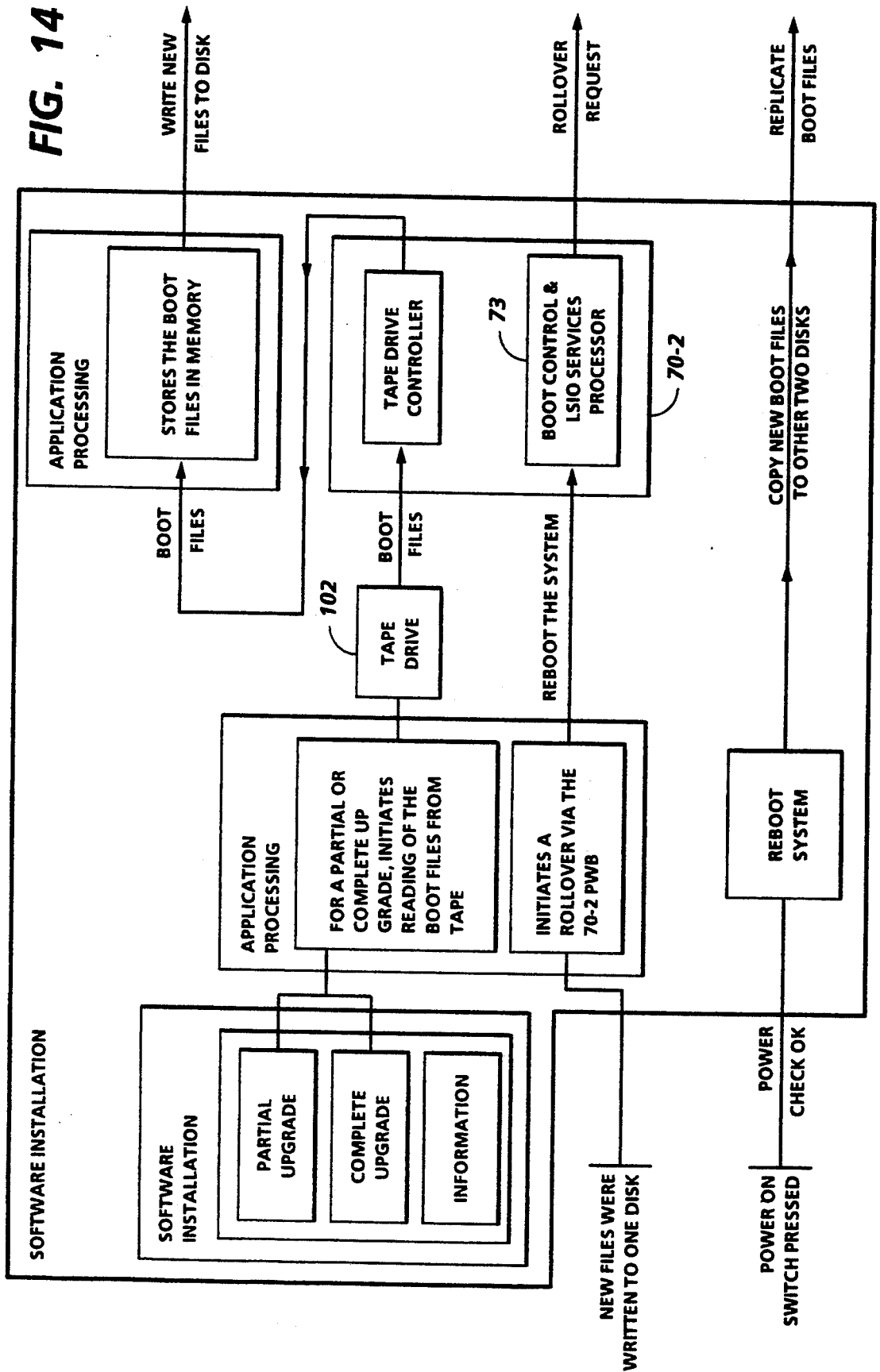
FIG. 14 is a block diagram depicting the process for installing new or upgraded software from streaming tape.

Referring to FIGS. 6 and 7, system, files 142 are normally permanent files which must be maintained. To assure retention, system files 142 are replicated on each of the disks 90-1, 90-2, 90-3 at the same address. Replicated files are written simultaneously to all three disks 90-1, 90-2, 90-3, with the disk heads in the same position.

System files 142, whether updates 120 of data files 122 that occur periodically during operation and life of the system 2 or new files such as new or upgraded software entered as software boot files 124, are written to one disk, as for example center disk 90-2, through Disk Drive Control Processor 82 for disk 90-2. The system files are thereafter migrated to the other disks, in this case, top and bottom disks 90-1, 90-3. Read control 118 reads system files 142 from any one of the disks 90-1, 90-2, 90-3. For additional explanation, reference is had to copending U.S. patent application Ser. No. 07/678,925, filed Apr. 1, 1990, to Christopher Comparetta et al, and entitled "A Process For Replacing storage Media In Electronic Printing Systems", the disclosure of which is incorporated by reference herein.

As a result, both super disk files (i.e., image files 140 that are distributed equally on each disk 90-1, 90-2, 90-3 of the system) and replicated files (i.e., duplicate system files 142 on each disk 90-1, 90-2, 90-3) are created. When super disk files are accessed, all disks 90-1, 90-2, 90-3 are busy retrieving/storing data from/to disks. When a copy of a replicated file is accessed for reading, only one disk is busy. Since reading a file from a single disk takes longer than accessing a super disk file, Channel Loader/Scheduler Processor 76 (FIG. 4) schedules single disk access to all disks 90-1, 90-2, 90-3 in parallel, allowing the system to retrieve more than one file at a time.

Processor identification seals, which comprise for example a 12 byte quantity having a 6 byte time stamp read from the system real time clock 84 (seen in FIG. 3B) and a 6 byte processor identification (PROC ID), are provided. The PROC ID is kept on a chip 69 socketed onto PWB 70-2 (seen in FIG. 3B) and remains with the machine in the event PWB 70-2 is replaced. A copy of the processor ID and initialized time stamp is stored in system NVM 63 on PWB 70-2 (seen in FIG. 3B). On each disk 90-1, 90-2, 90-3, the disk Physical Volume Root Page 85 (PV Root Page ), which includes a PV Root Page seal comprising the PROC ID seal plus the position of the disk in the super disk setup, is stored at page zero.

With the identification seals described above, replacement of one of the disks 90-1, 90-2, 90-3 or PWB 70-2 can be determined. Further, the identification seals enable switching or swapping of the disks with one another to be detected.

Referring to FIGS. 3A, 3B, 7-14, and TABLE 1, boot file 124 with boot software is replicated on each of the disks 90-1, 90-2, 90-3 for booting system 2. In order to disk boot system 2, the boot software loads the necessary files from the boot disk into memory and enables execution of the software. Since boot file 124 is replicated on all disks 90-1, 90-2, 90-3, the system can boot from any disk and inform the operator when one disk is not available. In the subsequent explanation, disk 90-2 is presumed to be the boot disk.

As will be understood, it is necessary to boot the system when power is first switched on (Cold Boot initiated) or when necessary during system operation (Warm Boot initiated). For example, a manual 'Boot' button (not shown) is provided for initiating a Warm Boot.

In a Cold Boot, the system processors 78, except for a maintenance panel 95, are in a reset state. On power up, maintenance panel 95 checks to determine if power input is correct, and if so, releases reset lines contained in a Boot Bus 92. Boot Bus 92 is coupled to Boot & LSIO service processor 73 and UI communication controller 80 on PWB 70-2 through boot bus processor 75, and to channel loader/scheduler processor 76 on PWB 70-10 through boot bus processor 77. The reset lines release processors 76 and 73 and UI communication controller 80 allowing Boot Bus 92 during the boot sequence to transmit software programs from PWB 70-2 to processor 76 on PWB 70-10 for downloading to each processor channel 81. Once communications are established, Boot Channel 93 initializes all channels 81 to enable downloading of the micro code instructions by channel Loader/Scheduler processor 76 as described in TABLE I.

Whenever the system is booted, the PROC ID stored in chip 69 is read and compared with the PROC ID from the Sys NVM Seal and the Sys NVM Seal compared with the PV Boot Page Seal to determine if PWB 70-2 is defective or if any disk has been replaced. The PROC ID is compared with the PV Root Page Proc. ID to see if the booting disk was replaced.

When the boot file 124 cannot be read off the specified boot disk, the disk number is incremented and the booting process continues using a second disk. If the second disk is found to be unavailable, booting from the third disk is tried. Where booting cannot be made from any disk following a preset number of tries, the system returns to a service dialogue routine in Diagnostic Manager 56, requiring servicing by the Tech Rep and booting of the system through the use of streaming tape using streaming tape boot button 98 (seen in FIG. 12).

Figure 15:
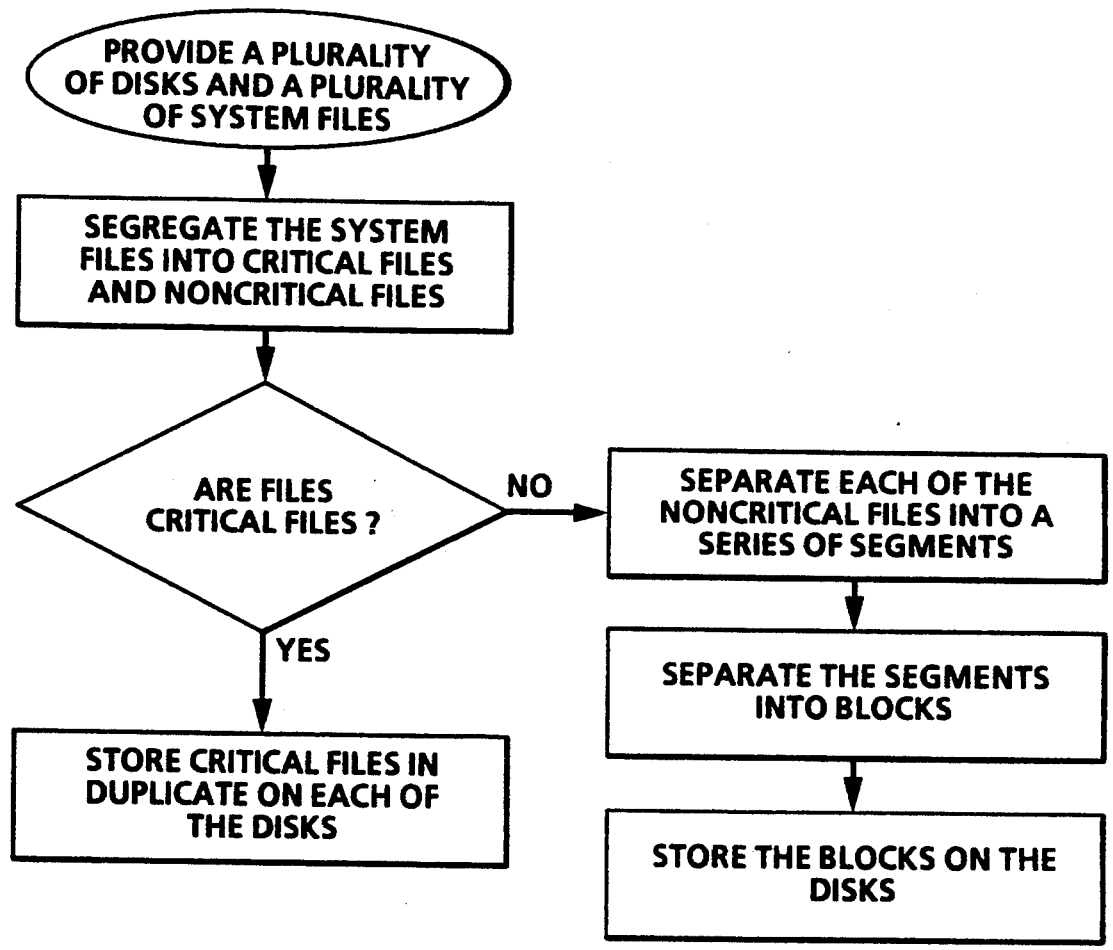
FIG. 15 is a flow diagram depicting a file storage process embodying one aspect of the disclosed invention.

Referring to FIG. 15, an overview of one aspect of the above-described embodiment is illustrated by way of a flow chart in which critical files are stored in duplicate on each of disks 90-1, 90-2 and 90-3 (FIGS. 5-7) or noncritical files are stored, in the form of blocks, across the same disks.

While the invention has been described with reference to the structure disclosed, it is not confined to the details set forth, but is intended to cover such modifications or changes as may come within the scope of the following claims.

TABLE I

Boot Sequence Control-Normal Boot

1. POWER & CABLE CONNECTIONS ARE CHECKED BOTH TO SCANNER 4 & PRINTER 8
2. SYSTEM MEMORY 61 TESTED & INITIALIZED. CHANNEL PROCESSORS 81 PERFORM READS & WRITES TO VARIOUS SECTIONS OF MEMORY 61
3. DISK CONTROLLER MICROCODE IS DOWNLOADED TO DISK CONTROLLER PROCESSORS 82 VIA BOOT BUS 92 & BOOT DOWNLOAD CONTROL LOGIC 79
4. IF COLD BOOT, SPIN-UP COMMANDS SENT TO DISK DRIVES 83 (IF WARM BOOT, CHECKS MADE TO SEE IF ALL DISKS 90-1, 90-2, 90-3 ARE SPINNING)
5. CHANNEL LOADER MICROCODE IS SENT VIA BOOT BUS 92 TO PWB 70-10. MICROCODE IS THEN DOWNLOADED USING BOOT DOWNLOAD CONTROL LOGIC 79 TO CHANNEL LOADER/SCHEDULER PROCESSOR 76.
6. CHANNEL LOADER/SCHEDULER PROCESSOR 76 REQUESTS THAT DISK CONTROLLER PROCESSOR 82 RETRIEVE THE CONTROLLER MICROCODE FILE FROM DISK 90-2. DISK CONTROLLER PROCESSOR 82 SHIPS FILE TO MEMORY 61. CHANNEL LOADER/SCHEDULER PROCESSOR 76 THEN DOWNLOADS MICROCODE TO EACH CHANNEL USING BOOT DOWNLOAD CONTROL LOGIC.
7. CHANNEL LOADER/SCHEDULER PROCESSOR 76 REQUESTS THAT DISK CONTROLLER PROCESSOR 83 RETRIEVE THE APPLICATION SOFTWARE LOADER PROGRAM FROM DISK 90-2. DISK CONTROLLER PROCESSOR 83 SHIPS FILE TO MEMORY 61.
8. SCHEDULER MICROCODE IS DOWNLOADED INTO CHANNEL LOADER/SCHEDULER PROCESSOR 76. PROCESSOR 76 WILL NOW PERFORM ONLY AS A SCHEDULER PROCESSOR.
9. APPLICATION SOFTWARE LOADER PROGRAM IS STARTED. APPLICATION SOFTWARE IS RETRIEVED FROM DISK 90-2 & STORED IN MEMORY 61.
10. UI 52, SCANNER 4, & PRINTER 8 SOFTWARE IS DOWNLOADED.

We claim:

1. A file storage process for a printing system in which said printing system includes printer means for producing prints from image data and plural disks providing permanent memory for storing system files, wherein the plural disks include a first disk with a plurality of platters and a second disk with a plurality of platters, comprising the steps of:

a) segregating said system files into critical files requiring a high level of file integrity and non-critical files requiring a lower level of file integrity;
b) storing said critical files in duplicate on each of said disks to provide file backup and assure said high level of file integrity such that one critical file is stored in one or more of the platters of the first disk and another critical file is stored in one or more platters of the second disk;
c) separating of said non-critical files into a series of segments each having a predetermined number of bytes with a total number of said segments being an even multiple of the number of said disks;
d) separating said segments into blocks with the number of said segments in each block being equal to the number of said disks; and
e) storing said blocks of segments on said disks so that each of said segments in each of said blocks is stored on only one of said disks and one of said blocks is stored in one or more of the platters of the first disk and another of said blocks is stored in one or more platters of the second disk.

2. The process according to claim 1 including the step of:
storing each of said critical file duplicates at a respective identical address on each of said disks.

3. The process according to claim 1 including the step of:
storing said segments in each of said blocks at a respective identical address on each of said disks.

4. The process according to claim 1 including the step of:
in response to an overlapping demand for two of said critical files, accessing one of said critical files from one of said disks and the other of said critical files from a different one of said disks.

5. The process according to claim 1 including the step of:
placing said image data in said non-critical files.

6. A file storage process for a printing system in which said printing system includes printer means for producing prints from image data and plural disks providing permanent memory for storing system files, comprising the steps of:

a) segregating said system files into critical files requiring a high level of file integrity and non-critical files requiring a lower level of file integrity;
b) storing said critical files in duplicate on each of said disks to provide file backup and assure said high level of file integrity;
c) separating each of said non-critical files into a series of segments each having a predetermined number of bytes with the total number of said segments being an even multiple of the number of said disks;
d) separating said segments into blocks with the number of said segments in each block being equal to the number of said disks;
e) storing said blocks of segments on said disks so that each of said segments in each of said blocks is stored on only one of said disks;
f) placing said image data in said non-critical files; and
g) in response to a demand for said image data in one of said non-critical files, scheduling access to all of said disks in repeated predetermined sequence whereby to successively read out the segments for said one non-critical file to provide said image data.

7. A file storage process for a printing system in which said printing system includes printer means for producing prints from image data and plural disks providing permanent memory for storing system files, comprising the steps of:
   a) segregating said printing system files into critical files requiring a high level of file integrity and non-critical files requiring a lower level of file integrity;
   b) storing said critical files in duplicate on each of said disks to provide file backup and assure said high level of file integrity;
   c) separating each of said non-critical files into a series of segments each having a predetermined number of bytes with the total number of said segments being an even multiple of the number of said disks;
   d) separating said segments into blocks with the number of said segments in each block being equal to the number of said disks;
   e) storing said blocks of segments on said disks so that each of said segments in each of said blocks is stored on only one of said disks;
   f) storing each of said critical file duplicates at a respective identical address on each of said disks;
   g) including a boot file for booting said printing system in said critical files whereby duplicate boot files are provided on each of said disks;
   h) establishing a preset disk access priority for accessing said boot file;
   i) accessing said boot file on a first of said disks in accordance with said preset disk access priority; and
   j) where accessing of said boot file from said one disk fails, accessing said duplicate boot file from a second one of said disks in accordance with said preset disk access priority.

8. A file storage process for a printing system in which said printing system has N disks for storing files, wherein the N disks include a first disk with a plurality of platters and a second disk with a plurality of platters, comprising the steps of:
   a) segregating said files into critical files requiring a high level of file integrity and non-critical files requiring a lower level of file integrity;
   b) storing said critical files in duplicate on each of said disks to provide file backup and assure said high level of file integrity such that one critical file is stored in one or more of the platters of the first disk and another critical file is stored in one or more platters of the second disk;
   c) separating said non-critical files into a succession of file sectors of equal size with a total number of said file sectors being an even multiple of N;
   d) providing blocks of N file sectors; and
   e) storing one file sector from each of said blocks on each of said disks, such that one file sector is stored in one or more platters of the first disk and another file sector is stored in one or more platters of the second disk.

9. The process according to claim 8 including the step of:
   storing duplicates of said critical files at a respective identical address on each of said disks to enhance access.

10. The process according to claim 8 including the step of:
   storing said file sectors that comprise each of said blocks at a respective identical address on each of said disks to permit simultaneous access of said file sectors.

11. A file storage process for a printing system in which said printing system has at least a first disk and a second disk providing permanent memory for storing system files and image files, comprising the steps of:
   a) storing said system files in duplicate on each of said disks to provide file backup and assure said high level of system file integrity such that one system file is stored in one or more of the platters of the first disk and another system file is stored in one or more platters of the second disk;
   b) separating said image files into discrete image file segments of equal size;
   c) starting with a first one of the file segments of each of said image files, grouping successive file segments into blocks such that a number of file segments in each of said blocks is equal to or greater than two; and
   d) storing said blocks in succession on said disks so that each file segment in each of said blocks is stored on only one of said disks and one of said blocks is stored in one or more of the platters of the first disk and another of said blocks is stored in one or more platters of the second disk.

12. The process according to claim 11 including the step of:
   storing said system file duplicates at respective identical addresses on said disks.

13. The process according to claim 11 including the step of:
   storing said image file segments in each of said blocks at an identical disk address.

14. A file storage process for a printing system in which said printing system has at least two disks providing permanent memory for storing system files and image files, comprising the steps of:
   a) storing said system files in duplicate on each of said disks to provide file backup and assure said high level of system file integrity;
   b) separating said image files into discrete image file segments of equal size;
   c) starting with a first one of the file segments of each of said image files, grouping successive file segments into blocks such that a number of file segments in each of said blocks is equal to or greater than two;
   d) storing said blocks in succession on said disks so that each file segment in each of said blocks is stored on only one of said disks;
   e) providing plural buffers for temporarily holding data for writing to said disks;
   f) linking those of said buffers having data to be written to contiguous locations on said disks together; and
   g) in response to accumulation of a predetermined amount of said data in said buffers, writing said data from said buffers to said disks.

15. A file storage process for a printing system in which said printing system has at least two disks providing permanent memory for storing system files and image files, comprising the steps of:
   a) storing said system files in duplicate on each of said disks to provide file backup and assure said high level of system file integrity;

b) separating said image files into discrete image file segments of equal size;

c) starting with the first file segment of each of said image files, grouping successive file segments into blocks such that the number of file segments in each of said blocks is equal to the number of said disks;

d) storing said blocks in succession on said disks so that each file segment in each of said blocks is stored on only one of said disks;

e) providing plural buffers for temporarily holding data for writing to said disks;

f) linking those of said buffers having data to be written to contiguous locations on said disks together;

g) in response to accumulation of a predetermined amount of said data in said buffers, writing said data from said buffers to said disks;

h) providing a boot file for booting said printing system to an operating condition with said system files;

i) pre-selecting a first one of said disks as a boot disk and a second one of said disks as a backup boot disk;

j) on a demand to boot said printing system accessing the boot file on said first disk; and k) on failure of said printing system to boot, re-booting said printing system by accessing the boot file on said second disk.

* * * * *